United States Patent
Vercier

(10) Patent No.: US 10,731,983 B2
(45) Date of Patent: Aug. 4, 2020

(54) MAGNETIC FIELD COMPENSATION METHOD, ASSOCIATED DEVICE AND COMPUTER PROGRAM

(71) Applicant: THALES, Courbevoie (FR)

(72) Inventor: Nicolas Jean-Marc Frédéric Vercier, Valence (FR)

(73) Assignee: THALES, Courbevoie (FR)

(*) Notice: Subject to any disclaimer, the term of this patent is extended or adjusted under 35 U.S.C. 154(b) by 211 days.

(21) Appl. No.: 16/123,119

(22) Filed: Sep. 6, 2018

(65) Prior Publication Data

US 2019/0078884 A1    Mar. 14, 2019

(30) Foreign Application Priority Data

Sep. 8, 2017    (FR) .................................... 17 00903

(51) Int. Cl.
*G01C 17/38* (2006.01)
*G01C 21/16* (2006.01)
*G01R 33/025* (2006.01)

(52) U.S. Cl.
CPC ............. *G01C 17/38* (2013.01); *G01C 21/16* (2013.01); *G01R 33/025* (2013.01)

(58) Field of Classification Search
CPC .................................................... G01C 17/38
(Continued)

(56) References Cited

U.S. PATENT DOCUMENTS 5,654,635 A    8/1997 Assous et al.
6,047,237 A *   4/2000 Michmerhuizen ..... G01C 17/38
                                                           33/300
(Continued)

FOREIGN PATENT DOCUMENTS

EP    0718598 A1    6/1996

OTHER PUBLICATIONS

French Search Report for French Application No. 17 00903 dated May 29, 2018.
(Continued)

*Primary Examiner* — George B Bennett
(74) *Attorney, Agent, or Firm* — Pearne & Gordon LLP

(57) ABSTRACT

A compensation method for a magnetic field on board a vehicle including the steps carried out by computer and consisting of: for each measuring time $T_i$, i=1 to N with N>1, collecting the measured values of the 3D magnetic field $Hm_i$ and those of the angles $\theta_i$ and $\varphi_i$, where $\theta_i$ is the pitch of the vehicle $\varphi_i$ is the roll of the vehicle; determining a matrix A and a vector B as a function at least of the collected magnetic field values $Hm_i$ and angles $\theta_i$ et $\varphi_i$, i=1 to N, the matrix A representing the soft iron and nonalignment disruptions and the vector B representing the hard iron disruptions; and the method comprising a step for estimating (105) the pair (A,B) minimizing the expression $$\sum_{i=1\grave{a}N}\left(\|A(Hm_i-B)\|-\frac{1}{N}\sum_{i=1\grave{a}N}(\|A(Hm_i-B)\|)\right)^2 +$$

$$\sum_{i=1\grave{a}N}\left(V_iA(Hm_i-B)-\frac{1}{N}\sum_{i=1\grave{a}N}(V_iA(Hm_i-B))\right)^2$$

where $V_i=[-\sin(\theta_i);\ \sin(\varphi_i).\cos(\theta_i);\ \cos(\varphi_i).\cos(\theta_i)]$.

9 Claims, 3 Drawing Sheets

(58) Field of Classification Search
USPC .......................................................... 33/356
See application file for complete search history.

(56) References Cited

U.S. PATENT DOCUMENTS

| | | | | |
|---|---|---|---|---|
| 6,651,003 B2* | 11/2003 | Woloszyk | ............... | G01C 17/38 33/356 |
| 2004/0236510 A1 | 11/2004 | Okerse et al. | | |
| 2008/0172174 A1* | 7/2008 | Okeya | .................... | G01C 17/38 33/356 |
| 2008/0289203 A1* | 11/2008 | Martikka | ............... | G01C 17/38 33/356 |
| 2009/0093981 A1* | 4/2009 | Withanawasam | ...... | G01C 17/28 702/93 |
| 2009/0115412 A1* | 5/2009 | Fuse | ..................... | G01R 33/09 324/252 |
| 2011/0066392 A1* | 3/2011 | Judd | ..................... | G01C 17/38 702/93 |
| 2011/0077889 A1* | 3/2011 | Vogt | ....................... | G01C 17/38 702/93 |
| 2015/0089823 A1* | 4/2015 | Garrone | ................ | G01C 17/38 33/303 |
| 2015/0160010 A1* | 6/2015 | Tang | .................. | G01R 33/0206 33/355 R |
| 2016/0069681 A1* | 3/2016 | Johnson | ................. | G01C 17/38 33/303 |

OTHER PUBLICATIONS

J.F. Vasconcelos, et al, "A Geometric Approach to Strapdown Magnetometer Calibration in Sensor Frame", IFAC Proceedings Volumes, vol. 41, Issue 1, 2008, pp. 172-177; https://www.sciencedirect.com/science/article/pii/S147466701535521X.

* cited by examiner

MAGNETIC FIELD COMPENSATION METHOD, ASSOCIATED DEVICE AND COMPUTER PROGRAM

GENERAL TECHNICAL DOMAIN

The present invention relates to the field of compensating for a magnetic field in the determination of the magnetic heading of a vehicle, based on measurements from a magnetic field sensor on board the vehicle.

Such a vehicle is for example an aircraft.

PRIOR ART

The measurements from an onboard magnetic field sensor are generally tainted by errors, due to magnetic disturbances (so-called soft iron disturbances and so-called hard iron disturbances) and/or to an alignment problem between the coordinate system trihedron of the vehicle and the coordinate system trihedron of the magnetic field sensor. This is why it is necessary, in order to obtain good quality heading values, to proceed, from measured magnetic field values, with an operation to compensate for these errors, to determine compensated magnetic field values, thus at least partially freed from these errors.

The compensating operation generally includes a compensation calibration phase defining a matrix A corresponding to the so-called soft iron disturbances and the alignment problem, and a vector B corresponding to the so-called hard iron disturbances.

For example, document EP 0,718,598 B1 is known, proposing a compensating solution for a magnetometer.

More specifically, the present invention relates to a compensation method for a magnetic field determined using a magnetic field sensor on board a vehicle in order to calculate the magnetic heading of said vehicle, said method comprising the steps carried out by computer and consisting of: for each measuring time $T_i$, i=1 to N with N>1, collecting the values of the 3D magnetic field $Hm_i$ coming from the magnetic field sensor and the angles $\theta_i$ and $\varphi_i$, where $\theta_i$ is the pitch of the vehicle $\varphi_i$ is the roll of the vehicle;

determining a matrix A and a vector B as a function at least of said collected magnetic field values $Hm_i$ and angles $\theta_i$ et $\varphi_i$, i=1 to N, the matrix A representing the soft iron and nonalignment disruptions between the vehicle and the magnetic field sensor and the vector B representing the hard iron disruptions.

The compensation calibration is, however, difficult to do at a high latitude (for example, latitudes greater than 60° or 70°), due to a signal-to-noise ratio that is then reduced (indeed, at a high latitude, the values of the two horizontal components of the magnetic field become much lower than the value of the vertical component of the magnetic field). The problem is generally gotten around by calibrating the compensation at a low altitude, but this is not always possible, in particular when the magnetic field sensor must be replaced in an airport at a high latitude.

Presentation of the Invention

To that end, according to a first aspect, the invention proposes a magnetic field compensation method according to the aforementioned type, characterized in that the determination of the matrix A and the vector B comprises a step for estimating the pair (A,B) minimizing the expression $$\sum_{i=1 \grave{a} N}\left(\|A(Hm_i - B)\| - \frac{1}{N}\sum_{i=1 \grave{a} N}(\|A(Hm_i - B)\|)\right)^2 +$$

$$\sum_{i=1 \grave{a} N}\left(V_i A(Hm_i - B) - \frac{1}{N}\sum_{i=1 \grave{a} N}(V_i A(Hm_i - B))\right)^2$$

where $V_i = [-\sin(\theta_i); \sin(\varphi_i).\cos(\theta_i); \cos(\varphi_i).\cos(\theta_i)]$.

The invention makes it possible to provide a good-quality compensation solution, even calibrated at a high latitude.

In embodiments, the magnetic field compensation method according to the invention further includes one or more of the following features:

- a low-pass filtering operation, the cutoff frequency of which is higher than the bandwidth of the trajectory of the vehicle, is applied to the magnetic field values $Hm_i$ and angles $\theta_i$ and $\varphi_i$, said step for estimating the pair (A,B) being carried out based on said filtered values;
- the step for estimating the pair (A,B) minimizing said expression is carried out by an iterative gradient descent algorithm of said expression;
- a magnetic heading of the vehicle is determined based on a compensated magnetic field, said compensated magnetic field depending on at least a magnetic field determined using the magnetic field sensor, said matrix A and said vector B previously determined.

According to a second aspect, the present invention proposes a compensation device for a determined magnetic field on board a vehicle, said device being suitable for collecting, for each measuring time $T_i$, i=1 to N with N>1, values of the measured 3D magnetic field $Hm_i$ and those of the angles $\theta_i$ and $\varphi_i$, where $\theta_i$ is the pitch of the vehicle and $\varphi_i$ is the roll of the vehicle, and for determining a matrix A and a vector B as a function at least of said collected magnetic field values $Hm_i$ and angles $\theta_i$ et $\varphi_i$, i=1 to N, the matrix A representing the soft iron and nonalignment disruptions between the vehicle and the magnetic field sensor and the vector B representing the hard iron disruptions; said device being characterized in that, during the determination of the matrix A and the vector B, it is suitable for estimating the pair (A,B) by minimizing the expression $$\sum_{i=1 \grave{a} N}\left(\|A(Hm_i - B)\| - \frac{1}{N}\sum_{i=1 \grave{a} N}(\|A(Hm_i - B)\|)\right)^2 +$$

$$\sum_{i=1 \grave{a} N}\left(V_i A(Hm_i - B) - \frac{1}{N}\sum_{i=1 \grave{a} N}(V_i A(Hm_i - B))\right)^2$$

where $V_i = [-\sin(\theta_i); \sin(\varphi_i).\cos(\theta_i); \cos(\varphi_i).\cos(\theta_i)]$.

According to a third aspect, the present invention proposes a computer program comprising software instructions which, when executed by a computer, carry out a method according the first aspect.

PRESENTATION OF FIGURES

These features and advantages of the invention will appear upon reading the following description, provided solely as an example, and done in reference to the appended drawings, in which.

DESCRIPTION OF ONE OR MORE EMBODIMENTS

Figure 1:
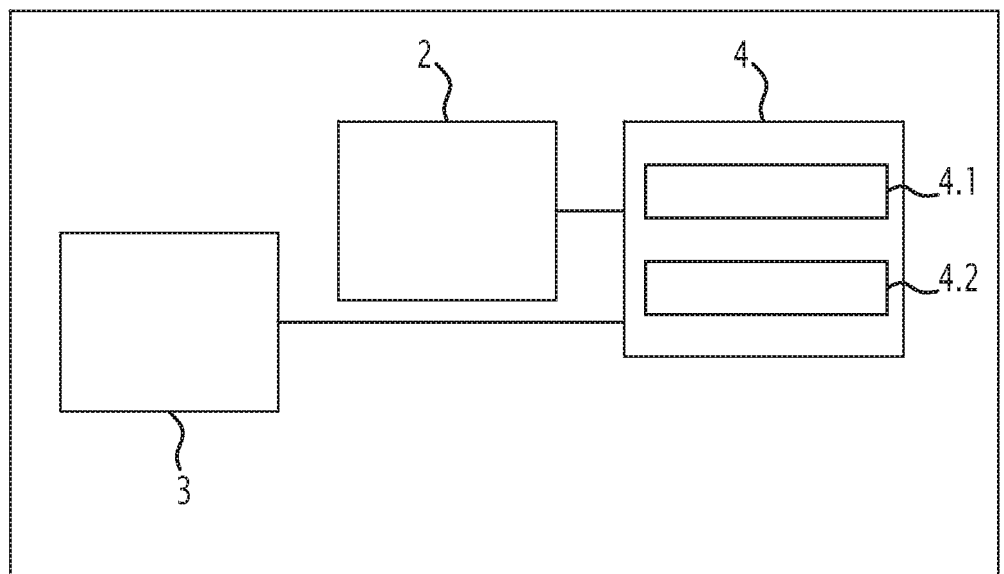
FIG. 1 shows a schematic view of a heading determination system of an airplane in one embodiment of the invention.

FIG. 1 shows a schematic view of a heading determination system 1 in one embodiment of the invention, on board in the considered case, on board an airplane (not shown). This heading determination system 1 is suitable for determining the heading of the airplane. It comprises a magnetic field sensor 2, an inertial unit 3 and a heading calculation unit 4.

The magnetic field sensor 2 is suitable, in a known manner, for measuring, in a coordinate system $R_a$ that is associated with it and that is theoretically identical to that associated with the airplane (i.e., with a longitudinal axis $X_a$ passing through the head and the tail of the airplane, an axis $Y_a$ perpendicular to X oriented toward the right wing and an axis $Z_a$ perpendicular to the two previous axes to form a direct trihedron, the value of the magnetic field vector H locally present and to provide the heading calculation unit 4 with the values of the magnetic field measured at successive measuring times. In the considered case, the magnetic field sensor 2 is a magnetometer.

The inertial unit 3 comprises, in a known manner, 3 gyrometers and 3 accelerometers and is suitable for integrating the movements of the airplane (acceleration and angular speed) and estimating, in a base coordinate system R comprising an axis Z oriented toward the Earth's center therefore providing the local vertical, an axis X oriented to the north and an axis Y oriented to the east, locally perpendicular to one another and to the axis Z, its orientation (roll, pitch and heading angles), its linear speed and its position. The inertial unit 3 is suitable for providing the heading calculation unit 4 with the values of the roll, pitch and heading angles estimated at the end of the measurements at the successive measuring times.

The heading calculation unit 4 is suitable for performing the compensation, in the magnetic fields measured by the magnetometer 2, of the following disturbances:
- soft iron disturbances, corresponding to the influence near the magnetometer 2, of ferromagnetic elements that are not fully magnetized, which become magnetized under the influence of the external field;
- so-called hard iron disturbances, due to the presence of magnetized ferromagnetic materials of the airplane; and
- alignment problem between the coordinate system of the airplane and that of the magnetometer, due to installation flaws.

The compensated measured magnetic field expressed in the coordinate system $R_a$ is deduced from the measured magnetic field Hm from the following relationship:

$$Hc = A(Hm - B),$$

with Hm=H+n, where H is the magnetic field (not noised) present in the measuring location, thus $$Hc = A(H + n - B),$$

where:
A, 3*3 matrix, represents the soft iron matrix, corresponding to the soft iron disturbances and also accounting for alignment problems; B, 3*1 vector, represents the hard iron vector corresponding to the hard iron disturbances. This component rotates with the magnetometer 2 and therefore the airplane;
n represents the other local noises not modeled on the measured magnetic field.

Before describing the steps carried out in the embodiment described here, some preliminary observations and considered hypotheses are given below.

The magnetic field compensation operation seeks to cancel the influence of alignment, soft iron and hard iron problems and to obtain the local compensated field (or a field proportional to the local field, since only the ratio between the components of the field is useful to calculate the heading) from the measured field, and to deduce the heading of the airplane therefrom.

The hypotheses used to calculate the compensated magnetic field are as follows:
Hyp1: the norm of the real compensated field is constant;
Hyp2: the compensated vertical field is constant in the base coordinate system R.

The matrix A and the vector B that will be used to determine the local compensated field are, according to the invention and as described in detail below in reference to FIG. 2 in one particular embodiment of the invention, estimated as minimizing the following expression called C1, the first group of terms of which reflects the first hypothesis, Hyp1, while the second group of terms reflects the second hypothesis, Hyp2:

$$C1 = \sum_{i=1 \grave{a} N} \left( \|A(Hm_i - B)\| - \frac{1}{N} \sum_{i=1 \grave{a} N} (\|A(Hm_i - B)\|) \right)^2 +$$

$$\sum_{i=1 \grave{a} N} \left( V_i A(Hm_i - B) - \frac{1}{N} \sum_{i=1 \grave{a} N} (V_i A(Hm_i - B)) \right)^2$$

System 1 has the advantage of not implementing an upstream method for compensating harmonizations]

where Hmi, i=1 to N, with N>1, represent the magnetic field values expressed in the coordinate system Ra at the measuring times Ti and Vi is the projection vector on the vertical axis of the base coordinate system R, i.e., Vi=[−sin (θi); sin(φi).cos(θi); cos(φ$_i$).cos(θ$_i$)], where θ$_i$ represents the pitch value of the vehicle and φ$_i$ the roll value of the airplane at the measuring times T$_i$.

In the embodiment described below, an iterative method for estimating the minimum of C1 is used.

The heading calculation unit 4 includes a preprocessing subunit 4.1 and a processing subunit 4.2, which are suitable for carrying out the steps of the heading calculation method 100 described below in reference to FIG. 2. The method 100 includes a first preprocessing sub-process 101, including steps 102 to 105, then a compensation processing step 106 and a heading calculation step 107.

The heading calculation unit 4 is suitable for collecting magnetic field values provided by the magnetometer 2 and the values of the roll, pitch and heading angles provided by the inertial unit 3, and storing them, in a memory, associated with the successive measuring times.

In one embodiment, the heading calculation unit 4 includes a processor and the operations, or at least some of these operations, carried out by the heading calculation unit 4 and described below in reference to FIG. 2 in particular, are carried out after the execution, on the processor, of software instructions stored in the memory.

Figure 2:
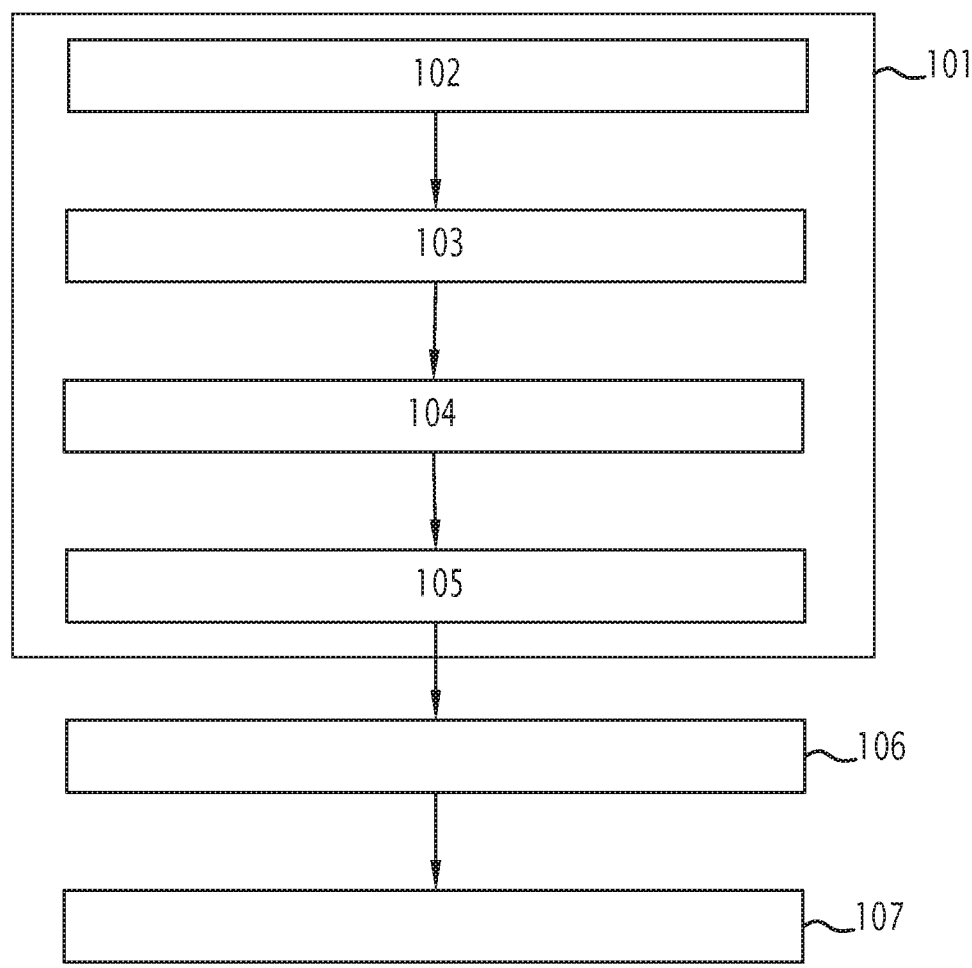
FIG. 2 is a flowchart of steps implemented in one embodiment of the invention.

Thus, in reference to FIG. 2, in a step 102 of the preprocessing sub-process 101, the preprocessing subunit 4.1 collects the values of N 3D magnetic field vectors expressed in the coordinate system of the airplane $R_a$ measured by the magnetometer 2 at measuring times $T_i$, i=1 to N, N>1, during the flight of the airplane (for example with a trajectory comprising at least two turns with roll initiation in one direction and the other and a takeoff, for pitch initiation).

The compensation calibration subunit 4.1 further collects the 2N roll, pitch angle values provided by the inertial unit 3 for the airplane for these measuring times $T_i$, i=1 to N.

In a step 103, the values of the N 3D magnetic field vectors and the 2N roll and pitch angle values for the moments $T_i$, i=1 to N, collected are filtered by the preprocessing subunit 4.1, using a low-pass filter. The cutoff frequency of the low-pass filter is chosen to be higher than the bandwidth of the trajectory of the airplane. The trajectory characteristics of the airplane whose spectrum is considered comprise the roll, pitch, heading. The field and angle values considered hereinafter are those derived from this filtering.

Then, in a step 104, the preprocessing subunit 4.1 defines an initial solution $(A_0, B_0)$ for the pair (A, B) that will serve as a starting point for the iterative search for a minimum of the expression C1. In one embodiment, the initial solution is determined by the method of the least-squares estimator also using the hypotheses Hyp1 and Hyp2 and the filtered magnetic field and angle values derived from step 103.

In a step 105, the preprocessing subunit 4.1 estimates the value of the pair (A, B) minimizing expression C1. In the considered case, it performs a gradient descent from the initial solution obtained in step 104 with the minimization of criterion C1:

$$\sum_{i=1\grave{a}N}\left(\|A(Hm_i - B)\| - \frac{1}{N}\sum_{i=1\grave{a}N}(\|A(Hm_i - B)\|)\right)^2 +$$

$$\sum_{i=1\grave{a}N}\left(V_iA(Hm_i - B) - \frac{1}{N}\sum_{i=1\grave{a}N}(V_iA(Hm_i - B))\right)^2$$

where:
- $Hm_i$, i=1 to N, with N>1, are the magnetic field values (after filtering in step 103) corresponding to the measuring terms $T_i$ and
- $V_i$ is the projection vector on the vertical axis of the base coordinate system R, i.e., $Vi=[-\sin(\theta i); \sin(\varphi i).\cos(\theta i); \cos(\varphi_i).\cos(\theta_i)]$, where $\theta_i$ is the pitch value of the vehicle and $\varphi_i$ the roll value of the airplane at the measuring times $T_i$ (after filtering in step 103).

This minimization criterion accounts for the hard and soft iron errors as well as the harmonization of the alignments of the airplane coordinate system and the magnetometer coordinate system at the same time. Unlike the traditional methods, which minimize the first group of terms of the criterion C1 with respect to a fixed value in place of the average of the norm of A(Hm−B) (1 for example in the following criterion: $C2=\Sigma(\|A(Hm-B)\|-1)^2$) and for which it is no longer possible (without additional knowledge) to use a fixed value for the magnetic field Z once the value of the norm has been set at 1. In the criterion C1, both criteria are satisfied at the same time without hypothesizing about the values of the field, aside from the fact that the latter is constant in terms of norm and vertical value. Of course, if A and B are taken to be nil, criterion C1 is fully satisfied. This is why one or several components are constrained to a fixed value. For example, in the considered embodiment, the value A(1,1) is set equal to 1 (or another constant) in the resolution: there will therefore ultimately be 11 unknowns (8 for matrix A and 3 for matrix B).

The gradient descent is then done traditionally by the preprocessing subunit 4.1 using an algorithm reiterating all of steps E1 to E5, given a previously calculated pair (A, B):

E1: the gradient of C1 is calculated relative to A and B.

The calculation of the gradient of C1 can be done analytically in this case and expressed from the terms below, denoting:

$$u_i = (H_i - B), \quad \frac{\partial\left(\|Au_i\| - \frac{1}{N}\sum_{i=1}^{N}(\|Au_i\|)\right)^2}{\partial A} =$$

$$2\left(\|Au_i\| - \frac{1}{N}\sum_{i=1}^{N}(\|Au_i\|)\right)\left(\frac{u_i \otimes Au_i}{\|Au_i\|} - \frac{1}{N}\sum_{i=1}^{N}\left(\frac{u_i \otimes Au_i}{\|Au_i\|}\right)\right)$$

$$\frac{\partial\left(\|Au_i\| - \frac{1}{N}\sum_{i=1}^{N}(\|Au_i\|)\right)^2}{\partial B} =$$

$$2\left(\|Au_i\| - \frac{1}{N}\sum_{i=1}^{N}(\|Au_i\|)\right)\left(-\frac{A^tAu_i}{\|Au_i\|} + \frac{1}{N}\sum_{i=1}^{N}\left(\frac{A^tAu_i}{\|Au_i\|}\right)\right)$$

$$\frac{\partial\left(V_iAu_i - \frac{1}{N}\sum_{i=1}^{N}(V_iAu_i)\right)^2}{\partial A} =$$

$$2\left(V_iAu_i - \frac{1}{N}\sum_{i=1}^{N}(V_iAu_i)\right)\left(u_i \otimes V_i^t - \frac{1}{N}\sum_{i=1}^{N}(u_i \otimes V_i^t)\right)$$

$$\frac{\partial\left(V_iAu_i - \frac{1}{N}\sum_{i=1}^{N}(V_iAu_i)\right)^2}{\partial B} =$$

$$2\left(V_iAu_i - \frac{1}{N}\sum_{i=1}^{N}(V_iAu_i)\right)\left(-A^tV_i^t + \frac{1}{N}\sum_{i=1}^{N}(A^tV_i^t)\right)$$

where $\otimes$ refers to the Kronecker symbol.

E2: The local optimal direction of descent is calculated from the inverse of the Hessian of C1 calculated in the previous iteration (and that could have been initialized identically).

E3: The optimal pitch is sought in the optimal direction (linear search), with the Armijo algorithmic method, for example. A new estimate of (A, B) is deduced from this for the current iteration.

E4: The inverse of the Hessian of C1 is estimated from an existing method: (DFP (Davidon-Fletcher-Powell) or BFGS (Broyden-Fletcher-Goldfarb-Shanno) method, for example.

E5: the method from E1 to E4 is reiterated until a convergence criterion (C1 below a threshold value) or a threshold number of iterations is met. The estimated pair (A, B) is then obtained.

The calibration thus being completed, the measured field compensation calculations the corresponding heading calculation may be done.

In a compensation step 106 carried out based on the preceding calibration phase, the processing subunit 4.2 receives a new measured (3D) field value Hm that is provided to it by the magnetometer 2 and determines the corresponding compensated field Hc based on this value Hm, and A and B estimated in step 105: Hc=A(Hm−B)

In a step 107, the processing subunit 4.2 calculates the magnetic heading Cap of the airplane from the components of the compensated measured magnetic field Hc determined in step 106: Cap=a tan 2(Hc$_y$,Hc$_x$) where Hc$_x$, Hc$_y$ are the components on the axes X and Y of the compensated measured magnetic field projected in the land-based horizontal plane. The projection is done by using the attitude angles derived from the inertial unit 3 for the measuring time corresponding to the measurement of the field Hm.

The proposed compensation calibration may be done in flight with a model having 11 states or on the ground with a reduced model to guarantee to the observability of the system.

Figure 3:
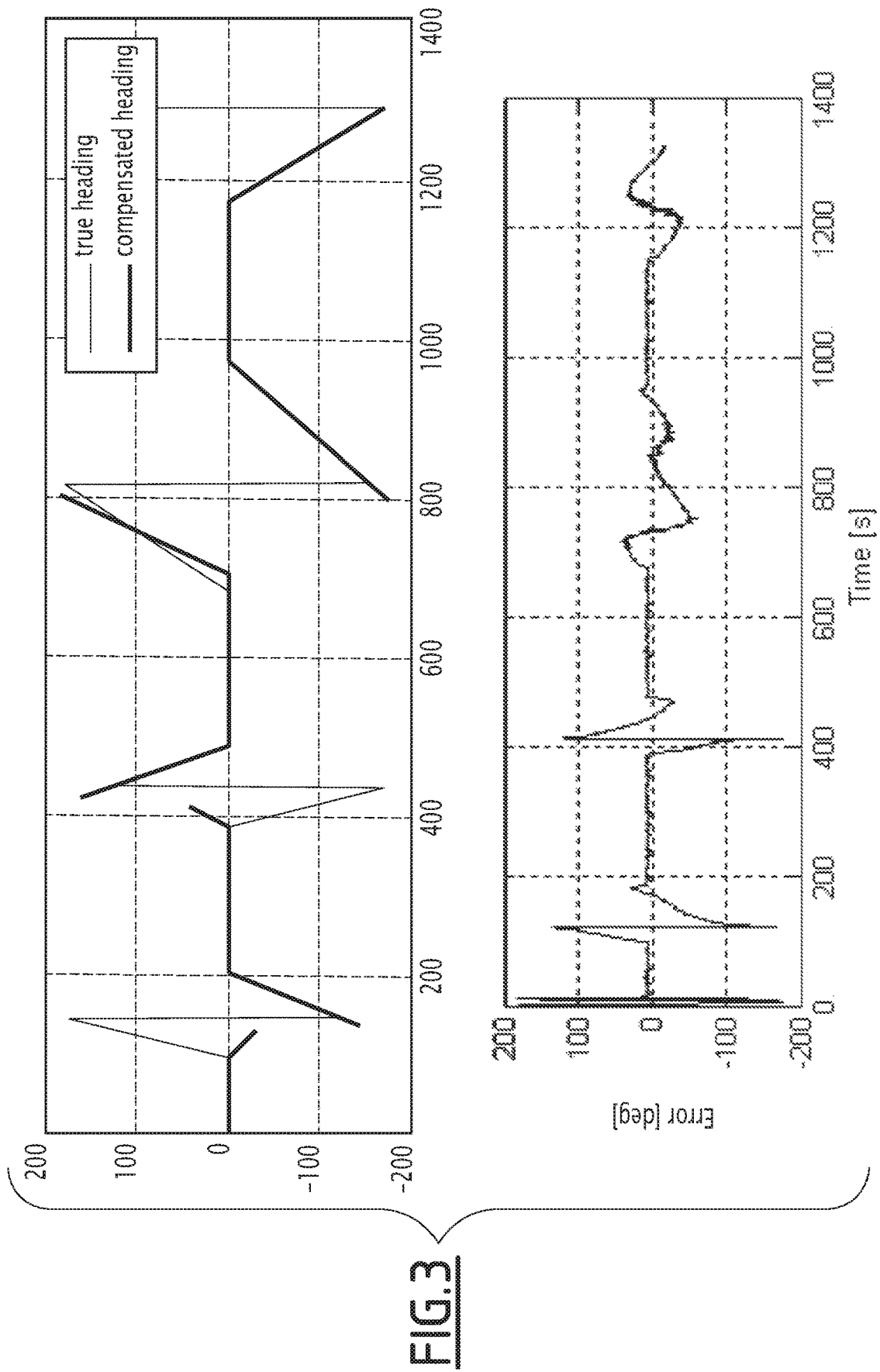
FIGS. 3 and 4 illustrate the result of different compensations done from same initial data.
Figure 4:
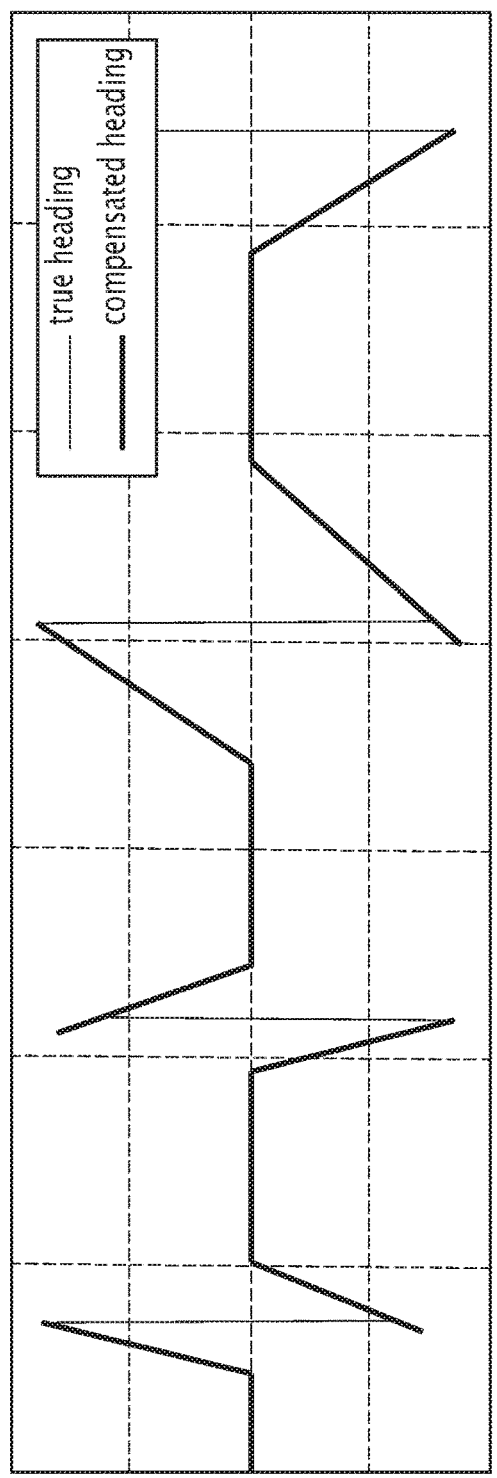
Figure 4:
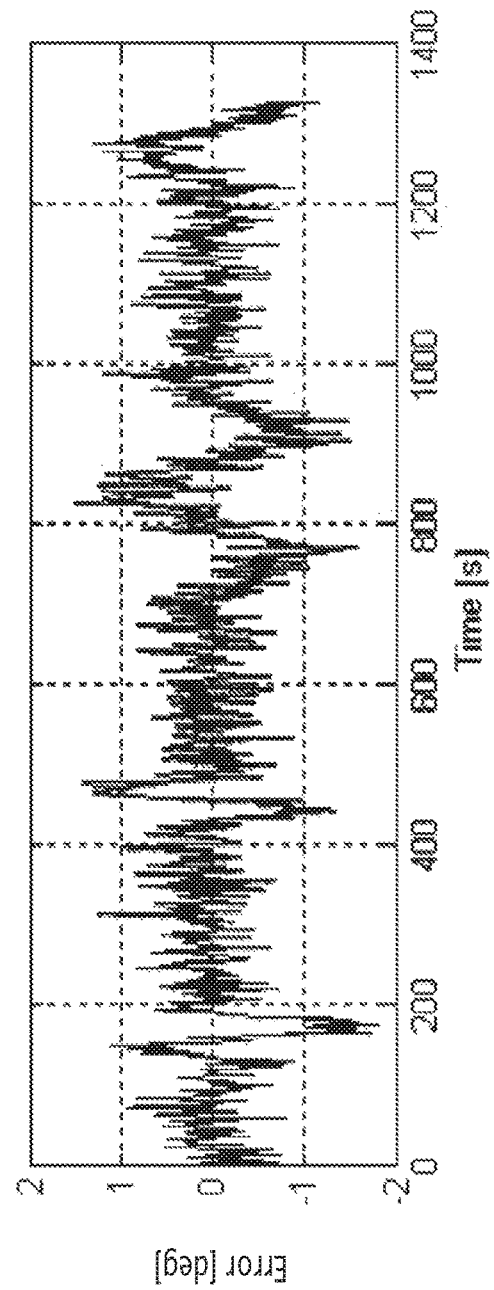

FIGS. 3 and 4 illustrate the results obtained on a theoretical simulation from initial common magnetic field and angle measurements with the following hypotheses:
- the compensation calibration is done at a latitude of 70°,
- the roll and pitch measurements are accurate
- the measurement noise is 0.005 Oe
- when filtering is done instantly, the same filtering is also applied on the roll and pitch angles.

In each of FIGS. 3 and 4, on the graph in the upper part of the figure, the true and compensated heading values are indicated on the y-axis [and] as a function of the indicated time on the x-axis while on the graph in the lower part of the figure, the error between the true heading and the compensated heading is shown on the y-axis. FIG. 3 corresponds to a compensation based on a compensation calibration with a least squares estimator (i.e., A and B determined by only the initial solution), while FIG. 4 corresponds to a compensation based on a compensation calibration with a least squares estimate having initiated a gradient descent with filtering as described above.

The present invention offers a good-quality compensation solution for all latitudes. It is robust with respect to measuring noises, and simultaneously corrects soft iron, hard iron and alignment flaws, thus harmonizing the airplane and the magnetometer. It does not assume any knowledge of the real or theoretical magnetic field, or any knowledge of the true heading (i.e., relative to geographical North), or the local magnetic heading (e.g., relative to magnetic North).

The invention is particularly advantageous for high latitudes and is of course also interesting for any latitude value.

It will be noted that the calibration operation in another embodiment of the invention is done without the filtering step 103. In embodiments, methods other than those proposed are used to define an initial solution for the iterative algorithm for approximating the minimum of C1 or for estimating a minimum of expression C1.

The embodiment described above in reference to the figures referred to an airplane. The invention can of course be used in other types of vehicles, such as drones, etc.

The invention claimed is:

1. A compensation method for a magnetic field determined on board a vehicle using a magnetic field sensor on board a vehicle in order to calculate the magnetic heading of said vehicle, said method comprising the steps carried out by computer and consisting of:

for each measuring time $T_i$, i=1 to N with N>1, collecting the values of the 3D magnetic field Hm$_i$, coming from the magnetic field sensor and the angles $\theta_i$ and $\varphi_i$, where $\theta_i$ is the pitch of the vehicle $\varphi_i$ is the roll of the vehicle;

determining a matrix A and a vector B as a function at least of said collected magnetic field values Hm$_i$ and angles $\theta_i$ et $\varphi_i$, i=1 to N, the matrix A representing the soft iron and nonalignment disruptions between the vehicle and the magnetic field sensor and the vector B representing the hard iron disruptions; and wherein the determination of the matrix A and the vector B comprises a step for estimating the pair (A,B) minimizing the expression $$\sum_{i=1 \grave{a} N}\left(\|A(Hm_i - B)\| - \frac{1}{N}\sum_{i=1 \grave{a} N}(\|A(Hm_i - B)\|)\right)^2 + \sum_{i=1 \grave{a} N}\left(V_i A(Hm_i - B) - \frac{1}{N}\sum_{i=1 \grave{a} N}(V_i A(Hm_i - B))\right)^2$$

where $V_i = [-\sin(\theta_i); \sin(\varphi_i).\cos(\theta_i); \cos(\varphi_i).\cos(\theta_i)]$.

2. The magnetic field compensation method according to claim 1, according to which a low-pass filtering operation, the cutoff frequency of which is higher than the bandwidth of the trajectory of the vehicle, is applied to the magnetic field values Hm$_i$, and angles $\theta_i$ and $\varphi_i$, said step for estimating the pair (A,B) being carried out based on said filtered values.

3. The magnetic field compensation method according to claim 1, wherein the step for estimating the pair (A,B) minimizing said expression is carried out by an iterative gradient descent algorithm of said expression.

4. The magnetic field compensation method according to claim 1, wherein a magnetic heading of the vehicle is determined based on a compensated magnetic field, said compensated magnetic field depending on at least a magnetic field determined using the magnetic field sensor, said matrix A and said vector B previously determined.

5. A compensation device for a determined magnetic field on board a vehicle, said device being configured for collecting, for each measuring time $T_i$, i=1 to N with N>1, values of the measured 3D magnetic field Hm$_i$, and those of the angles $\theta_i$ and $\varphi_i$, where $\theta_i$ is the pitch of the vehicle and $\varphi_i$ is the roll of the vehicle, and for determining a matrix A and a vector B as a function at least of said collected magnetic field values Hm$_i$, and angles $\theta_i$ et $\varphi_i$, i=1 to N, the matrix A representing the soft iron and nonalignment disruptions between the vehicle and the magnetic field sensor and the vector B representing the hard iron disruptions;

said device being configured for, during the determination of the matrix A and the vector B, estimating the pair (A,B) by minimizing the expression $$\sum_{i=1 \grave{a} N}\left(\|A(Hm_i - B)\| - \frac{1}{N}\sum_{i=1 \grave{a} N}(\|A(Hm_i - B)\|)\right)^2 + \sum_{i=1 \grave{a} N}\left(V_i A(Hm_i - B) - \frac{1}{N}\sum_{i=1 \grave{a} N}(V_i A(Hm_i - B))\right)^2$$

where $V_i = [-\sin(\theta_i); \sin(\varphi_i).\cos(\theta_i); \cos(\varphi_i).\cos(\theta_i)]$.

6. The magnetic field compensation device according to claim 5, comprising a low-pass filter, the cutoff frequency of which is higher than the bandwidth of the trajectory of the vehicle, being suitable for filtering the magnetic field values Hm$_i$ and angles $\theta_i$ and $\varphi_i$, the estimation of the pair (A,B) being carried out based on said filtered values.

7. The magnetic field compensation method according to claim 5, suitable for implementing an iterative gradient descent algorithm of said expression for estimating the pair (A,B) minimizing said expression.

8. The magnetic field compensation device according to claim 5, suitable for determining a magnetic heading of the vehicle based on a compensated magnetic field, said compensated magnetic field depending on at least one measured magnetic field, said matrix A and said vector B previously determined.

9. A computer program comprising software instructions which, when executed by a computer, carry out a magnetic field compensation method according to claim 1.

* * * * *